(12) United States Patent
Usami

(10) Patent No.: US 6,777,328 B2
(45) Date of Patent: Aug. 17, 2004

(54) METHOD OF FORMING MULTILAYERED CONDUCTIVE LAYERS FOR SEMICONDUCTOR DEVICE

(75) Inventor: Tetsuo Usami, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/187,840

(22) Filed: Jul. 3, 2002

(65) Prior Publication Data

US 2003/0235977 A1 Dec. 25, 2003

(30) Foreign Application Priority Data

Jan. 31, 2002 (JP) ........................................ 2002-023791

(51) Int. Cl.⁷ ......................... H01L 21/44; H01L 23/52
(52) U.S. Cl. ...................... 438/660; 438/653; 438/927; 257/767; 257/751; 257/486
(58) Field of Search .................................. 438/660–663, 438/653, 643, 627, 927; 257/750–753, 765, 486, 450, 376, 17, 767

(56) References Cited

U.S. PATENT DOCUMENTS

| | | | | | |
|---|---|---|---|---|---|
| 4,427,461 | A | * | 1/1984 | Kindlimann | ................ 148/16.6 |
| 5,242,860 | A | * | 9/1993 | Nulman et al. | ............. 437/190 |
| 5,459,353 | A | * | 10/1995 | Kanazawa | .................... 257/751 |
| 5,847,459 | A | * | 12/1998 | Taniguchi | .................... 257/751 |
| 5,972,179 | A | * | 10/1999 | Chittipeddi et al. | ... 204/192.17 |
| 6,080,665 | A | * | 6/2000 | Chen et al. | .................. 438/653 |

* cited by examiner

Primary Examiner—Matthew Smith
Assistant Examiner—Lee Calvin
(74) Attorney, Agent, or Firm—Volentine Francos, PLLC

(57) ABSTRACT

A method of manufacturing a semiconductor device including forming an insulator layer on an integrated circuit, forming a barrier layer having a first titanium film and a titanium nitride film on the insulator layer, heat-treating the barrier layer to release nitrogen gas from the titanium nitride film, forming a second titanium film on the barrier layer, and forming an aluminum film used as a wired metal on the second titanium film.

15 Claims, 4 Drawing Sheets

METHOD OF FORMING MULTILAYERED CONDUCTIVE LAYERS FOR SEMICONDUCTOR DEVICE

BACKGROUND OF THE INVENTION

The present invention relates to a semiconductor device and a method of manufacturing the same, and particularly to a method of forming a multilayered conductive layer for a semiconductor device, which improves electromigration resistance.

A conventional multilayered conductive layer configuration employed in a semiconductor device is generally illustrated as a sectional structure shown in FIG. 6. An aluminum (Al) film 14 as a conductive layer is used, and a titanium (Ti) film 12 and a titanium nitride (TiN) film 13 provided on the Ti film 12 are used as a barrier layer 16 on an insulator layer 11 deposited on an integrated circuit 10, so as to avoid a conductive layer-to-layer leak developed by diffusion of Al thereof into an insulating film. Now, the Ti film is effective in improving the quality of an Al film, principally, its orientation, and an improvement in the orientation of the Al film provides the effect of enhancing electromigration resistance. This electromigration (EM) is a phenomenon in which atoms are moved by the flow of a current. Since it produces a failure such as breaking of a conductive layer, an improvement in EM resistance is essential to the enhancement of reliability. Further, the TiN film 13 is needed to prevent the reaction of the Ti film and the Al film for the wired metal.

Next, the Al film 14 used as the wired metal is deposited by heating at 200° C. to 400° C. The reason why heating is made upon the formation of the Al film, is to make an Al grain large by heating to enhance the EM resistance and to improve step coverage (state of a film deposited on a step) in a contact hole. The migration has been considered to take place along a grain boundary. Since the grain boundary is reduced if the Al grain is relatively set larger than a conductive layer width, the electromigration (EM) can be restrained.

Thereafter, Ti, TiN, or a laminated layer of Ti and TiN, for example is deposited as an antireflection film (ARM) 15 relative to an Al surface based on a photolithography process. Further, the so-deposited film is subjected to a photolithography process and an etching process and then to patterning, whereby each of conductive layers is formed.

In the above method on the other hand, since the Al film 14 is deposited at the high temperature of from 200° C. to 400° C. upon deposition thereof after the formation of the TiN film 13, nitrogen gas ($N_2$ gas) is released from the surface of the TiN film 13 and from within the TiN film 13 to within an Al deposition chamber, so that $N_2$ is brought into the Al film 14. It has generally been known that the mixing of $N_2$ gas upon Al deposition interferes with the growth of a grain and hence EM resistance is degraded. Thus, the present method had a problem that reliability was degraded.

SUMMARY OF THE INVENTION

The present invention has been made in view of the above problem involved in the conventional semiconductor device and semiconductor device manufacturing method, particularly, the method of forming the multilayered conductive layer for the semiconductor device. It is an object of the present invention to provide a novel and improved semiconductor device and a method of manufacturing the semiconductor device, which are capable of preventing $N_2$ from being captured during the deposition of a conductive layer Al film and enhancing electromigration resistance.

The present invention provides a method of manufacturing a semiconductor device, comprising, forming an insulator layer on an integrated circuit, forming a barrier layer comprised of a first titanium film and a titanium nitride film on the insulator layer, heat-treating the barrier layer to release nitrogen gas from the titanium nitride film, forming a second titanium film on the barrier layer, and forming an aluminum film used as a wired metal on the second titanium film.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1A:
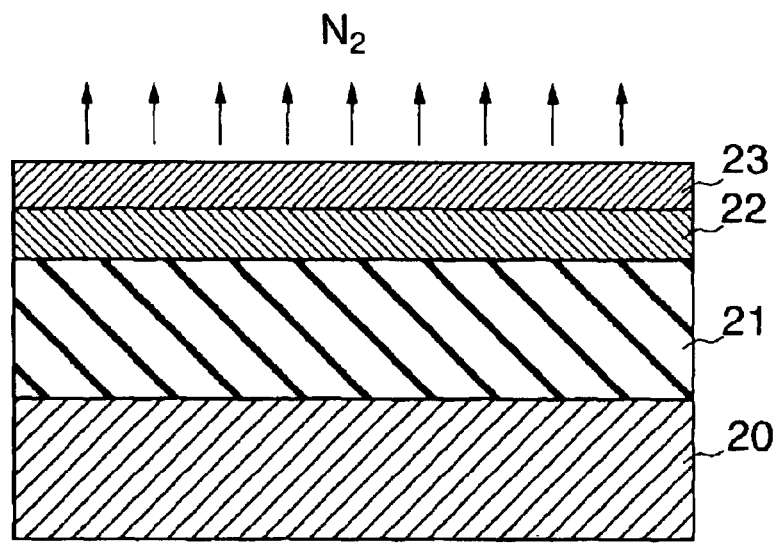
FIG. 1(a) is a process sectional view showing a multilayered conductive layer structure of a semiconductor device according to a first embodiment of the present invention, subsequent to the discharge of $N_2$ gas after the deposition of a TiN film.

Preferred embodiments of semiconductor devices according to the present invention, and methods of manufacturing the semiconductor devices will hereinafter be described in detail with reference to the accompanying drawings. Elements of structure having substantially the same functional configurations in the present specification and the drawings are respectively identified by the same reference numerals and the description of certain common elements will therefore be omitted.

First Embodiment

A process sectional view for describing a first embodiment of the present invention is shown in FIG. 1. An insulator layer 21 is first formed on an integrated circuit 20. Next, a Ti film 22 and a TiN film 23, which serve as a barrier layer, are respectively successively deposited over the insulator layer 21 with a thickness of about 30 nm and a thickness of about 20 nm. Now the deposition of the respective films employed in the present embodiment is all carried out using a multichamber sputtering apparatus. The Ti film 22 serves as a barrier for preventing Al for a wired metal to be formed later from diffusing into the insulator layer 21, whereas the TiN film 23 prevents the Ti film 22 and an Al film 25 from reacting with each other.

Thereafter, a wafer is heated at about 350° C. corresponding to a temperature greater than or equal to a temperature for the deposition of the conductive layer Al film for 60 seconds or more within a processing chamber in which the wafer is heated to a high temperature, thereby releasing $N_2$ gas from the surface of the TiN film 23 and from within the TIN film 23. The result thereof is shown in FIG. 1(a). Owing to the release of the $N_2$ gas, the TiN film 23 results in a TiN film 23' whose surface layer portion is low in nitrogen concentration. A Ti film 29, which is a few ten Å (Angstroms) or so, is further deposited on a barrier layer formed of the Ti film 22 and the TiN film 23' in this way. The Ti film 29 per se nitrizes and absorbs the nitrogen gas $N_2$ discharged from the TiN film 23' upon the subsequent formation of conductive layer Al film 25.

Figure 1B:
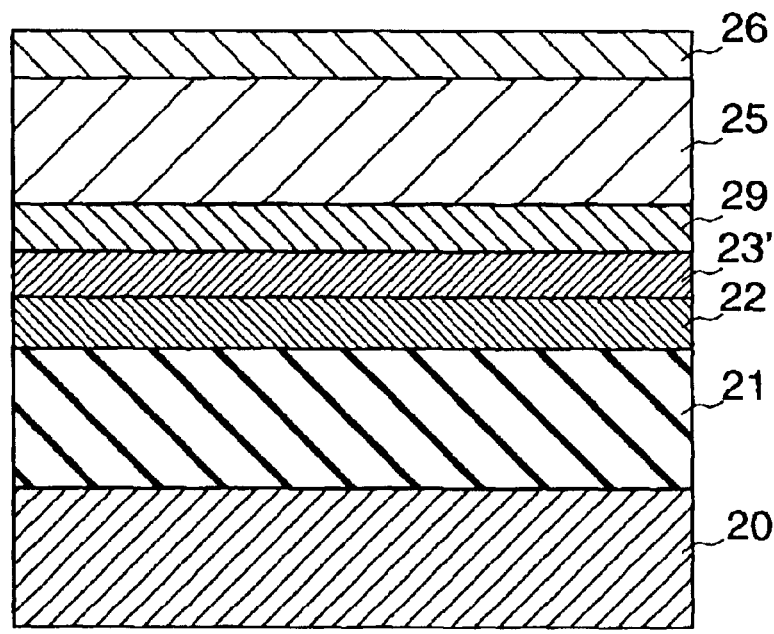
FIG. 1(b) is a process sectional view showing the multilayered conductive layer structure of the semiconductor device according to the first embodiment of the present invention, subsequent to the formation of a Ti film, an Al film and an antireflection film after the discharge of the $N_2$ gas.

Next, the wired Al film 25 is heated at about 225° C. to increase an Al grain and enhance EM resistance, so that it is deposited or grown so as to range from 400 nm to 600 nm in thickness. Thereafter, an antireflection film (ARM) 26 relative to an Al surface based on a photolithography process for forming micro patterns is formed on the Al film 25 with a thickness of about 70 nm. The result thereof is shown in FIG. 1(b). As the antireflection film, may preferably be, for example, a Ti single layer, a TiN single layer or a laminated layer of Ti and TiN. Further, the so-formed film is subjected to a photolithography process and an etching process and then to patterning, whereby each of conductive layers is formed.

According to the first embodiment as described above, a TiN film is deposited and thereafter a wafer is heated at a temperature greater than or equal to an Al deposition temperature within a processing chamber in which the wafer is heated at a high temperature, to release $N_2$ gas from the TiN film in advance, whereby a TiN film whose surface layer portion is low in nitrogen concentration, is formed. Further, a thin Ti film per se, which nitrizes and absorbs $N_2$, is formed on the TiN film. Consequently, $N_2$ gas heated to a high temperature upon Al deposition and discharged from the TiN film is prevented from floating in an Al deposition chamber. It is thus possible to prevent $N_2$ from being mixed into the Al film upon its deposition and restrain degradation of EM resistance.

Second Embodiment

Figure 2:
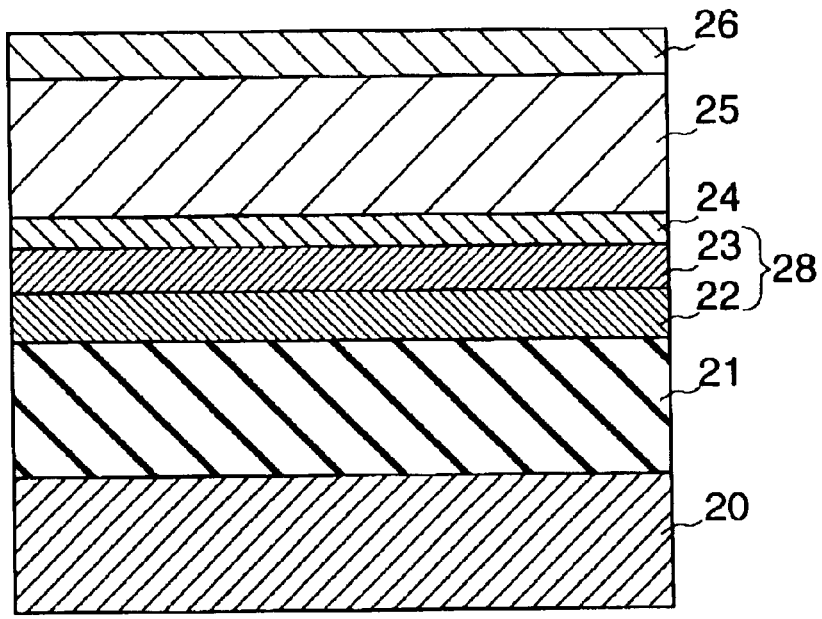
FIG. 2 is a cross-sectional view showing a multilayered conductive layer structure of a semiconductor device according to a second embodiment of the present invention.

A structural cross-section of a second embodiment of the present invention is shown in FIG. 2. An insulator layer 21 is first formed on an integrated circuit 20. Next, a Ti film 22 and a TiN film 23 are respectively successively deposited on the insulator layer 21 as a barrier layer 28 with a thickness of about 30 nm and a thickness of about 20 nm. Further, a thin conductive film 24 having a thickness of about several tens of Å, which prevents penetration of nitrogen gas discharged from the TiN film 23 upon the subsequent formation of a conductive layer Al film 25, is deposited on the barrier layer 28. As the conductive film 24 for preventing the penetration of $N_2$, may preferably be used, for example, Al or Cu.

Next, the Al film 25 used as a conductive layer, is heated at about 225° C. in a manner similar to the first embodiment, so it is grown so as to range from 400 nm to 600 nm in thickness. Thereafter, an antireflection film (ARM) 26 relative to an Al surface based on a photolithography process for forming micro patterns is formed on the Al film 25 with a thickness of about 70 nm. Further, the so-formed film is subjected to a photolithography process and an etching process and then to patterning, whereby each of conductive layers is formed.

According to the second embodiment as described above, a TiN film is deposited and thereafter a thin conductive film for preventing penetration of $N_2$ is formed, whereby $N_2$ gas heated to a high temperature upon Al deposition and discharged from the surface of the TiN film and from within the TiN film is prevented from floating into an Al deposition chamber. Thus, it is possible to prevent $N_2$ from being mixed into the Al film upon its deposition and restrain degradation of EM resistance.

Third Embodiment

Figure 3:
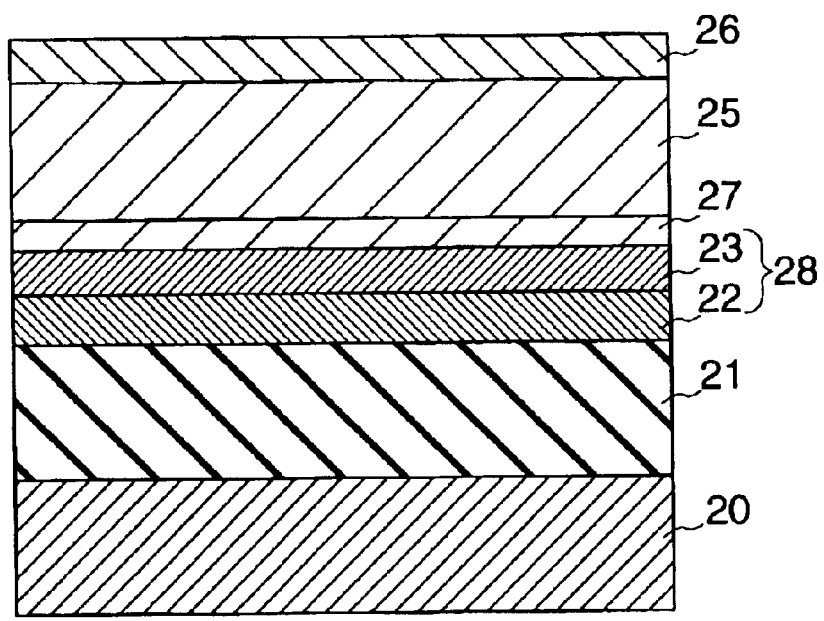
FIG. 3 is a cross-sectional view illustrating a multilayered conductive layer structure of a semiconductor device according to a third embodiment of the present invention.

A structural cross-section of a third embodiment of the present invention is shown in FIG. 3. An insulator layer 21 is first formed on an integrated circuit 20. Next, a Ti film 22 and a TiN film 23 are respectively deposited on the insulator layer 21 as a barrier layer 28 with a thickness of about 30 nm and a thickness of about 20 nm. Further, a conductive film 27 having a film thickness of about a few tens Å, which nitrizes $N_2$ for itself and absorbs nitrogen gas, is deposited on the barrier 28. As the conductive film 27, which absorbs the $N_2$, may preferably be tantalum (Ta).

Next, an Al film 25 is deposited so as to range from 400 nm to 600 nm in thickness under a temperature of about 225° C. in a manner similar to the first embodiment. An antireflection film (ARM) 26 is grown thereon with a thickness of about 70 nm. Further, the so-formed film is subjected to a photolithography process and an etching process and then to patterning, whereby each of conductive layers is formed.

According to the third embodiment as described above, since a TiN film is deposited and thereafter such a thin conductive film as to nitrize and absorb $N_2$ for itself is formed, $N_2$ gas heated to a high temperature upon Al deposition and discharged from the surface of the TiN film and from within the TiN film is prevented from floating into an Al deposition chamber. Thus, it is possible to prevent $N_2$ from being mixed into the Al film upon its deposition and restrain degradation of EM resistance.

Fourth Embodiment

Figure 4A:
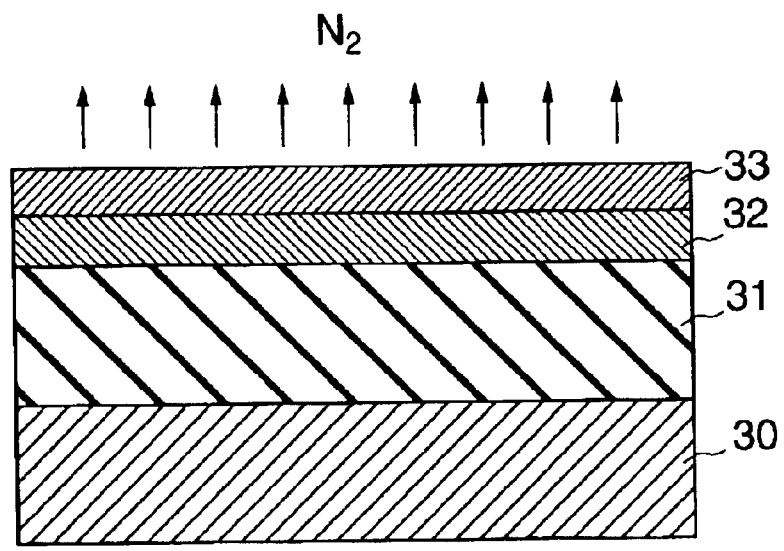
FIG. 4(a) is a process sectional view showing a multilayered conductive layer structure of a semiconductor device according to a fourth embodiment of the present invention, subsequent to the discharge of $N_2$ gas after the deposition of a TiN film.

A process sectional view for describing a fourth embodiment of the present invention is shown in FIG. 4. An insulator layer 31 is first formed on an integrated circuit 30. Next, a Ti film 32 and a TiN film 33, which serve as a barrier layer, are respectively successively deposited on the insulator layer 31 with a thickness of about 30 nm and a thickness of about 20 nm. Thereafter, a wafer is heated at about 350° C. corresponding to a temperature greater than or equal to a temperature for the deposition of a conductive layer Al film for 60 seconds or longer within a processing chamber in which the wafer is heated to a high temperature, thereby allowing $N_2$ gas to be released from the surface of the TiN film and from within the TiN film. The result thereof is shown in FIG. 4(a).

Figure 4B:
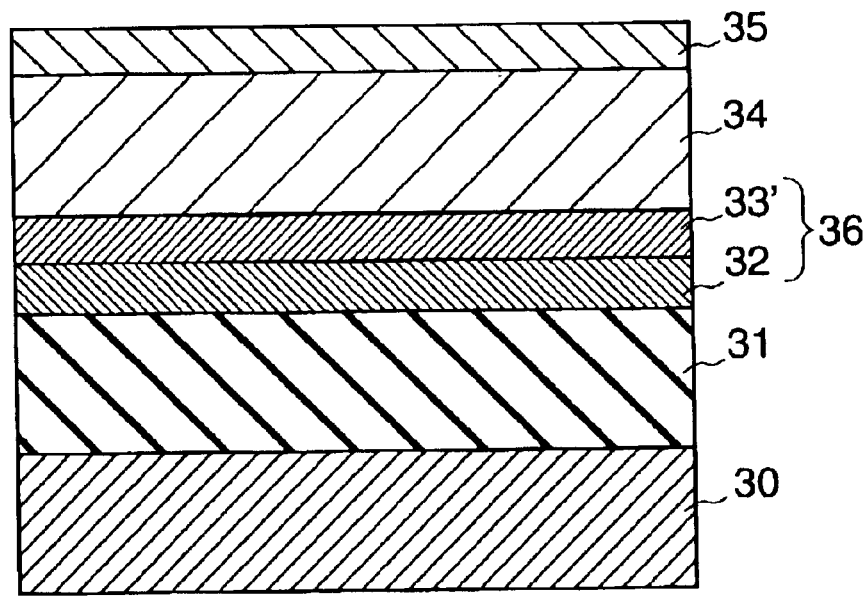
FIG. 4(b) is a process sectional view illustrating the multilayered conductive layer structure of the semiconductor device according to the fourth embodiment of the present invention, subsequent to the formation of an Al film and an antireflection film after the discharge of the $N_2$ gas.

Thus, the TiN film results in a TIN film 33' from which the $N_2$ gas is released. Thereafter, an Al film 34 is deposited on a barrier layer 36 formed with the TiN film 33' on the Ti film 32 at a temperature of about 225° C. so as to range from 400 nm to 600 nm in thickness in a manner similar to the first embodiment. Since, at this time, the $N_2$ gas has already been released from the TiN film, $N_2$ can be prevented form being mixed into the Al film 34. Afterwards, an antireflection (ARM) film 35 is deposited with a thickness of about 70 nm. The result thereof is shown in FIG. 4(b). Further, the so-deposited film is subjected to a photolithography process and an etching process and then to patterning, whereby each of conductive layers is formed.

According to the fourth embodiment as described above, a TiN film is deposited and thereafter a wafer is heated to a temperature greater than or equal to an Al deposition temperature within a processing chamber in which the wafer is heated to a high temperature, thereby releasing $N_2$ gas from the TiN film in advance. Therefore, the $N_2$ gas discharged from the surface of the TiN film and from therewithin is reduced even if it is heated to the high temperature upon the Al deposition. Thus, it is possible to prevent $N_2$ from being mixed into the Al film upon its deposition and restrain degradation of EM resistance.

Fifth Embodiment

Figure 5:
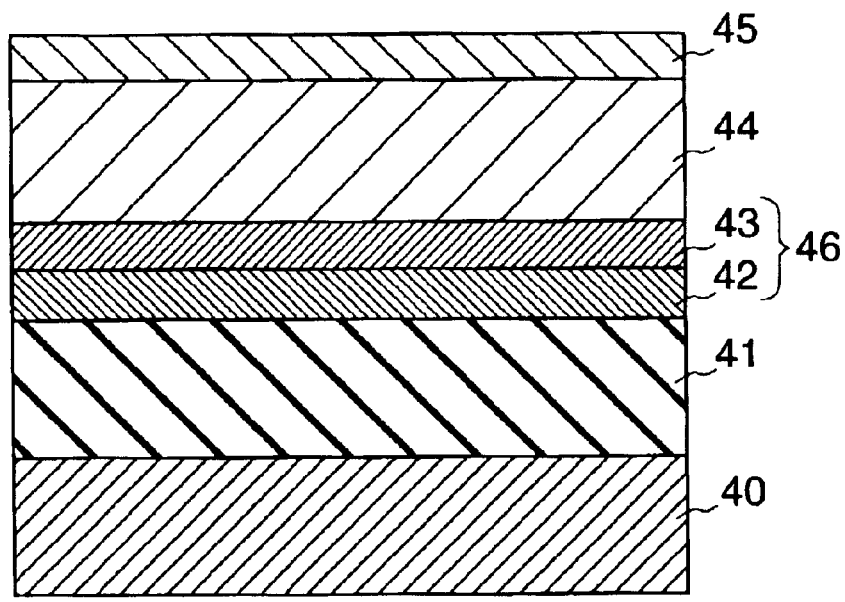
FIG. 5 is a cross-sectional view depicting a multilayered conductive layer structure of a semiconductor device according to a fifth embodiment of the present invention.
Figure 6:
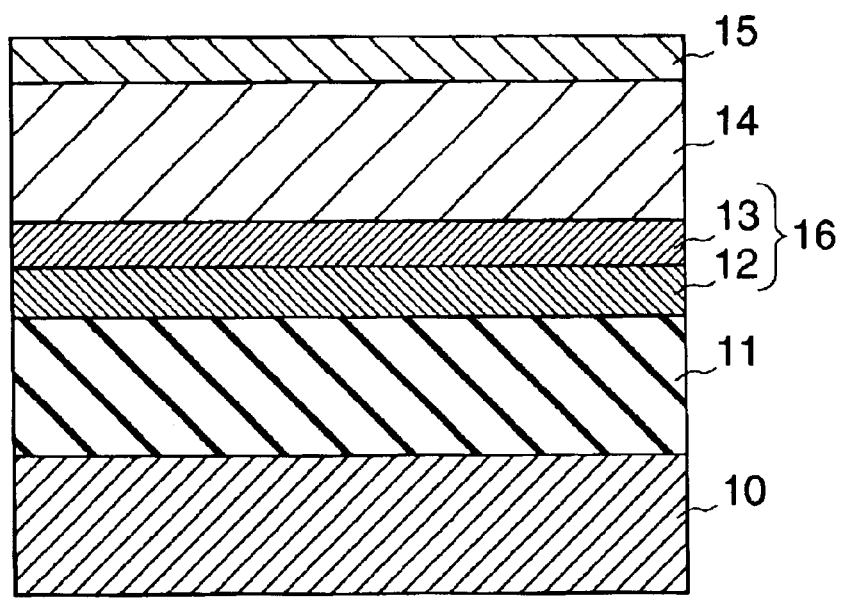
FIG. 6 is a cross-sectional view showing a multilayered conductive layer structure of a semiconductor device according to a related art.

A structural section of a fifth embodiment of the present invention is shown in FIG. 5. An insulator layer 41 is first formed on an integrated circuit 40. Next, a Ti film 42 and a TiN film 43 are respectively successively deposited on the insulator layer 41 as a barrier 46 with a thickness of about 30 nm and a thickness of about 20 nm by using a multi-chamber sputtering apparatus. Now Ar is added to $N_2$ used as deposition gas to form TiN upon deposition of the TiN film 42 by a reactive sputter. If an additive flow ratio of Ar gas to $N_2$ gas is set to 50% or more, for example, then the release of $N_2$ is avoided in a subsequent Al film forming step. However, when the additive flow rate of the Ar gas increases excessively, the film will result in Ti other than TiN. Since a condition for the additive flow rate of the Ar gas, which allows the film to transition from the TiN to Ti, greatly varies depending on a growth condition, it is necessary to execute the above processing on a TiN film forming condition although the definition of the upper limit of the ratio of addition thereof by a numerical value is not described herein.

Next, an Al film 44 is deposited on the barrier layer 46 so as to range from 400 nm to 600 nm in thickness at a temperature of about 225° C. Next, an antireflection film (ARM) 45 is deposited thereon with a thickness of about 70 nm. Further, the so-deposited film is subjected to a photolithography process and an etching process and then to patterning, whereby each of conductive layers is formed.

According to the fifth embodiment as described above, since the ratio of quality of flow between the $N_2$ gas and the Ar gas is set to 50% or more as the condition under which the TiN films formed as the barrier layer are deposited, the concentration of $N_2$ discharged from the surface of the TiN film and from within the TiN film decreases. Further, the $N_2$ gas discharged from the surface of the TiN film and from therewithin is reduced even if it is heated to a high temperature upon Al deposition. Thus, it is possible to prevent $N_2$ from being mixed into the Al film upon its deposition and restrain degradation of EM resistance.

While the preferred embodiments of the semiconductor devices and the semiconductor device manufacturing methods according to the present invention have been described above with reference to the accompanying drawings, the present invention is not limited to such embodiments. It will be apparent to those skilled in the art that various changes or modifications can be supposed to be made to the invention within the scope of a technical idea described in the following claims. It should be understood that those changes or modifications fall within the technical scope of the present invention.

In the present application, no device claim is claimed. However, the following claims may be claimed in a separate application.

A semiconductor device having a multilayered conductive layer, comprises:

an insulator layer formed on an integrated circuit;

a barrier layer comprised of a first titanium film and a titanium nitride film whose surface layer portion is low in nitrogen concentration, said barrier layer being formed on the insulator layer;

a second titanium film formed on the barrier layer; and an aluminum film used as a wired metal, which is formed on the second titanium film.

In the semiconductor device, the second titanium film may be a thin film which is about a few tens Å.

As another example, a semiconductor device having a multilayered conductive layer, comprises:

an insulator layer formed on an integrated circuit;

a barrier layer comprised of a titanium film and a titanium nitride film, which is formed on the insulator layer;

a conductive film formed on the barrier layer, for preventing the discharge of nitrogen gas from the titanium nitride film; and an aluminum film used as a wired metal, which is formed on the conductive film.

In the semiconductor, the conductive film maybe a film for preventing penetration of the nitrogen gas.

In the semiconductor device, the conductive film may be formed of aluminum or copper.

In the semiconductor device, the conductive film may be a thin film that is about several tens of Å.

Further, in the semiconductor device, the conductive film may be a film that absorbs the nitrogen gas.

In the semiconductor device, the conductive film may be comprised of tantalum. The conductive film may be a thin film which is about a few tens Å.

According to the present invention as described above, since a method of forming a multilayered conductive layer avoids interference with the growth of grains due to the mixing of nitrogen gas discharged from a titanium nitride film in a barrier layer when aluminum used as a wired metal is formed by being heated at a temperature of 200° C. to 400° C., electromigration resistance can be improved and reliability of a semiconductor device can be enhanced.

What is claimed is:

1. A method of manufacturing a semiconductor device having a multilayered conductive layer, comprising:

forming an insulator layer on an integrated circuit;

forming a barrier layer comprised of a first titanium film and a titanium nitride film on the insulator layer;

heat-treating the barrier layer to release nitrogen gas from the titanium nitride film;

forming a second titanium film on the barrier layer after said heat-treating; and forming an aluminum film used as a wired metal on the second titanium film.

2. A method of manufacturing a semiconductor device comprising:

providing a semiconductor substrate;

forming a barrier layer on the semiconductor substrate;

subjecting the barrier layer to a heat-treatment at a first temperature so that nitrogen gas is released from the barrier layer;

forming a nitrogen gas absorption layer on the barrier layer after the heat-treatment; and after said forming a nitrogen gas absorption layer, forming a metal layer over the barrier layer at a second temperature that is equal to or lower than the first temperature.

3. A method of manufacturing a semiconductor device according to claim 2, wherein the formation of the barrier layer includes forming a first Ti layer on the semiconductor substrate and forming a TIN layer on the first Ti layer.

4. A method of manufacturing a semiconductor device according to claim 2, wherein the formation of the nitrogen gas absorption layer includes forming a second Ti layer on the barrier layer.

5. A method of manufacturing a semiconductor device according to claim 2, wherein the formation of the metal layer includes forming an Al layer on the nitrogen gas absorption layer.

6. A method of manufacturing a semiconductor device according to claim 2, wherein the second temperature is about 225° C.

7. A method of manufacturing a semiconductor device according to claim 2, wherein the first temperature is about 350° C.

8. A method of manufacturing a semiconductor device according to claim 2, further comprising forming an antireflection film on the metal layer.

9. A method of manufacturing a semiconductor device according to claim 8, wherein the formation of the antireflection film includes forming a TiN layer on the metal layer.

10. A method of manufacturing a semiconductor device comprising:

providing a semiconductor substrate;

forming a barrier layer on the semiconductor substrate;

subjecting the barrier layer to a heat-treatment at a first temperature so that nitrogen gas is released from the barrier layer;

forming a nitrogen gas prevention layer on the barrier layer after the heat treatment; and forming a metal layer on the nitrogen gas prevention layer.

11. A method of manufacturing a semiconductor device according to claim 10, wherein the formation of the barrier layer includes forming a first Ti layer on the semiconductor substrate and forming a TIN layer on the first Ti layer.

12. A method of manufacturing a semiconductor device according to claim 10, wherein the nitrogen gas prevention layer includes Al or Cu.

13. A method of manufacturing a semiconductor device according to claim 10, wherein the formation of the metal layer includes forming an Al layer on the nitrogen gas prevention layer.

14. A method of manufacturing a semiconductor device according to claim 10, further comprising forming an antireflection film on the metal layer.

15. A method of manufacturing a semiconductor device according to claim 14, wherein the formation of the antireflection film includes forming a TiN layer on the metal layer.

* * * * *